(12) United States Patent
Becker et al.

(10) Patent No.: US 7,655,115 B1
(45) Date of Patent: Feb. 2, 2010

(54) LONG-LIVED PHOTO-PROTONATED CARBOCATION FOR PHOTOCHROMIC, PHOTOCONDUCTIVE LIQUIDS

(75) Inventors: Carol A. Becker, Del Mar, CA (US); Wayne E. Glad, Del Mar, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 679 days.

(21) Appl. No.: 11/159,975

(22) Filed: Jun. 23, 2005

(51) Int. Cl.
*C07C 1/00* (2006.01)
(52) U.S. Cl. ................................. 204/158.14
(58) Field of Classification Search ............ 204/158.14
See application file for complete search history.

(56) References Cited

OTHER PUBLICATIONS

Eberson et al., "Generation and Reactions of Radical Cations from the Photolysis of Aromatic Compounds with Tetranitromethane in 1,1,1,3,3,3-Hexafluoropropan-2-ol", Research on Chemical Intermediates, vol. 22, No. 9, no month, 1996, pp. 799-820.*
Bouas-Laurent, Henri & Hienz-Durr, 2001. "*Organic Photochronism*," Pure Appl. Chem., vol. 73, pp. 639-665, no month.
Ireland, J. F. & P. A. H. Wyatt, 1976. "*Acid-Base Properties of Electronically Excited States of Organic Molecules*," Advances in Physical Organic Chemistry, vol. 12, pp. 132-221, no month.
McCormack, A.C.. C. M. McDonnell, R. A. M. O'Ferrall, A. C. O'Doneghue, and S. N. Pao, 2002. "*Protonated Benzofuran, Anthracene, Napthalene, Ethene, and Ethyne: Measurements and Estimates of pKa and pKr*," J. Am. Chem. Soc., vol. 124, pp. 8575-8573, no month.
Vander Donckt, E. D. Lietaer, & J. Nasielski, 1970. *Proprieties Acido-Basiques de Derives Aromatiques non Substitues dans les Etats Electroniques Exites Singulet et Triplet*, Bulletin de Societes Chemiques Belges, vol. 79, pp. 283-290, no month.
Steenken, S. And R. A. McClelland, 1990. "*248-mm Laser Flash Photoprotonation of Mesitylene, Hexameththylbenzene, and 1,3,5-Triethoxytenzene in 1,1,1,3,3,3-Hexafluorosiso-propyl Alchohol, Formation and Electrophylic Reactivities of the Cyclohexadienyl Cations*," J. Am. Chem. Soc., vol. 112, pp. 9648-9649, no month.

* cited by examiner

*Primary Examiner*—Edna Wong
(74) *Attorney, Agent, or Firm*—Kyle Eppele; Peter A. Lipovsky

(57) ABSTRACT

An apparatus and method provide a solute-solvent solution that allows the solute to become photo-protonated by the solvent on absorption of ultraviolet light. The solute is 1,2,3,4,5,6,7,8-octamethylanthracene (OMA). The solvent is 1,1,1,3,3,3-hexafluoro-2-propanol (HFIP). The protonated form of the solute absorbs visible light to change the coloration of the solution from a substantially clear state to a colored state.

9 Claims, 4 Drawing Sheets 1A.                                    1B.

1A.  1B.

OMA in HFIP
Decay at 465 nm After Laser Pulse

Protonated form lifetime = 4.6 seconds

OMA IN HFIP WITH WATER ADDITIONS

OMA IN HFIP WITH 0.25% TFA IN HFIP ADDITIONS

INDOORS        IN SUNLIGHT

LONG-LIVED PHOTO-PROTONATED CARBOCATION FOR PHOTOCHROMIC, PHOTOCONDUCTIVE LIQUIDS

BACKGROUND

This invention relates to substances known to change their light absorption characteristics when irradiated with light of different wavelengths.

Photochromism is a reversible change in the light absorption properties of a substance when the substance is irradiated with light of a different wavelength. Typically, irradiation with ultraviolet (UV) light will cause a photochromic substance to absorb visible light (become colored). The irradiating light can be either monochromatic or polychromatic. When the irradiating light is removed, the substance returns to a colorless state. These photochromic compounds have applications in a variety of fields, the most well known being eyeglasses that darken outdoors (in the UV and visible light of the sun) and return to a transparent state indoors. Other uses can be UV driven filters (optical switches), display elements, or optical recording media, for example. One such optical switch can take the form of a liquid-filled fiber-optic, for example.

Photochromism can occur through a variety of photochemical mechanisms. A discussion of many of these mechanisms is given in a review article by Henri Bouas-Laurent And Heinz Dürr.[1]

Some of the mechanisms for reversible photochromic reactions discussed by Bouas-Laurent and Dürr, and typical compound types that exhibit these mechanisms, are shown in Table 1.

TABLE 1

| Reaction Mechanism | Representative Compound Type |
| --- | --- |
| Pericyclic reactions | Spiropyrans |
| Cis-trans isomerization | Azo compounds |
| Intramolecular hydrogen transfer | Anils |
| Intramolecular group transfer | Polycyclic quinones |
| Dissociation processes (bond cleavage) | Triarylmethanes |
| Electron transfer | Viologens |

Photochromic molecules such as these relax back to a colorless form at different rates, depending on the chemistry involved. In general the back reaction rates are not externally adjustable. Obtaining a different relaxation rate usually requires the synthesis of a molecule with a modified structure. The relaxation lifetimes of photochromic molecules must often be different for different applications. For example, relaxation rates on the order of seconds may be desired for the steady state build up of coloration in a low light flux environment like sunlight, while much shorter relaxation rates would be desired for optical switches for communications.

SUMMARY

An apparatus and method provide a solute-solvent solution that allows the solute to become photo-protonated by the solvent on absorption of UV light. The solute is 1,2,3,4,5,6,7,8-octamethylanthracene (OMA). The solvent is 1,1,1,3,3,3-hexafluoro-2-propanol (HFIP). The protonated form of the solute absorbs visible light to change the coloration of the solution from a substantially clear state to a colored state.

Other objects, advantages and new features will become apparent from the following detailed description when considered in conjunction with the accompanied drawings.

DESCRIPTION

A photochromic material described herein uses a different photochemical mechanism than described in the cited Bouas-Laurent and Dürr article. This mechanism is photo-protonation. Photo-protonation is a relatively simple reaction that involves transfer of a proton from a solvent to an irradiated molecule.

Figure 1:
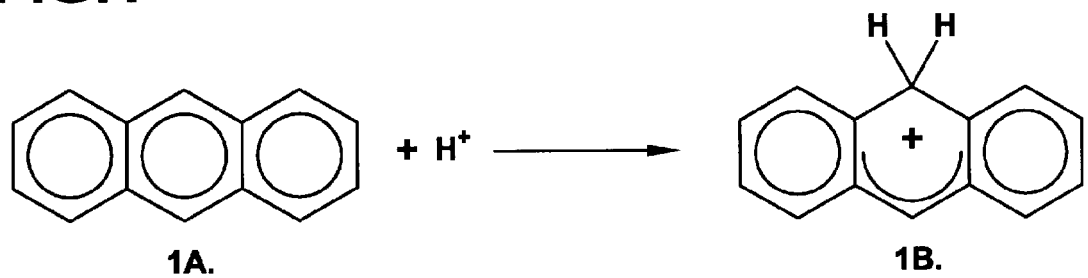
FIG. 1 illustrates the protonation of anthracene in water.

Photo-protonation is made possible by the equilibrium constants for protonation in excited states differing from those in the ground-state by as much as 29 orders of magnitude.[2] This difference allows some molecules that are not very basic in their ground-states to become significantly more basic in their excited states. FIG. 1 shows an example of this. Anthracene (1A), which is not normally thought of as a base, is actually a very weak base that can be protonated by very strong acids such as concentrated sulfuric acid. The equilibrium constant ($K_b$) for the ground-state protonation of anthracene in water, shown in FIG. 1, is about $10^{-14}$.[3] In contrast, because of a different electronic structure in the first excited singlet state, the estimated $K_b$ for the protonation reaction in the first excited singlet state is about $10^0$.[4] The increase in basicity is 14 orders of magnitude. Thus protonation in the excited state should occur in solvents other than extremely strong acids. Yet, the lifetime of the excited singlet state, as measured by its fluorescence lifetime, is very short (nanoseconds). As a result, the protonation reaction must be rapid to occur before the fluorescence decay of the excited state. Also, with such a short lifetime, a large amount of optical power would typically be required to maintain a significant concentration of excited molecules. However, it is known that Steenken and McClelland[5] observed the photo-protonation of simple aromatic molecules, among them 1,3,5-trimethoxy benzene (TMB), using laser flash photolysis. Unlike the photochromic material newly described herein, the protonated form of trimethoxybenzene does not absorb in the visible region of the spectrum. Also, the lifetime of protonated TMB has been subsequently measured by the present inventors and found to be 33 milliseconds. Thus the lifetime of the photochromic material described herein is more than two orders of magnitude greater than that of TMB.

Figure 2:
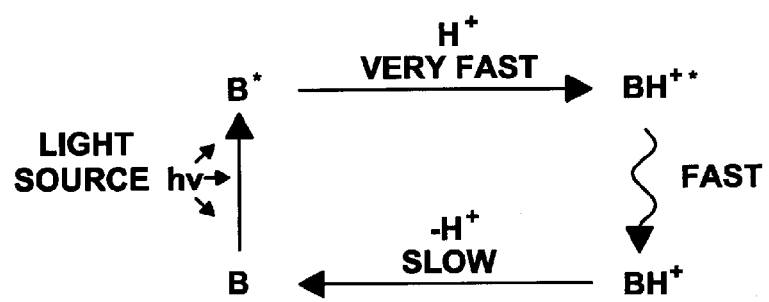
FIG. 2 illustrates a mechanism for photo-production of long-lived ground-state carbocations.

Referring now to FIG. 2, a process for generating a long-lived photo-protonated carbocation for photochromic, photo-conductive liquids is described. An example of such a process includes the solute 1,2,3,4,5,6,7,8-octamethylanthracene (OMA) ($2.4\times10^{-4}$ M, for example) in the solvent 1,1,1,3,3,3-hexafluoro-2-propanol (HFIP). In FIG. 2, the ground-state photochromic molecule OMA is represented by "B". Photoexcitation of molecule B, by a light source such as an eximer laser pulsed at 351 nm and within the power range of 10-150 milli-Joules/pulse, leads to the formation of excited state B*. Continuous wave excitation can also be used. B* is protonated very quickly (before B* decays back to ground-state B by fluorescence emission). $BH^{+*}$ decays quickly to the ground-state. The ground-state protonated form, $BH^+$, then decays relatively slowly back to the ground-state non protonated form B. Thus the formation and longevity of $BH^+$ depend on rapid protonation in the excited state and slow deprotonation in the ground-state. The deprotonation rate in the ground-state is a function of the solvent used in the photoprotonation experiment. The solvent 1,1,1,3,3,3-hexafluoro-2-propanol (HFIP), as used by Steenken and McClelland, is weakly acidic ($pK_a$=9.3), a poor nucleophile, and is reluctant to be protonated itself due to the inductive effect of the fluorine atoms in the molecule. HFIP is a strong enough acid to protonate aromatic compounds in the excited state and is extremely stabilizing to the ground-state cation that is formed.

Figure 3:
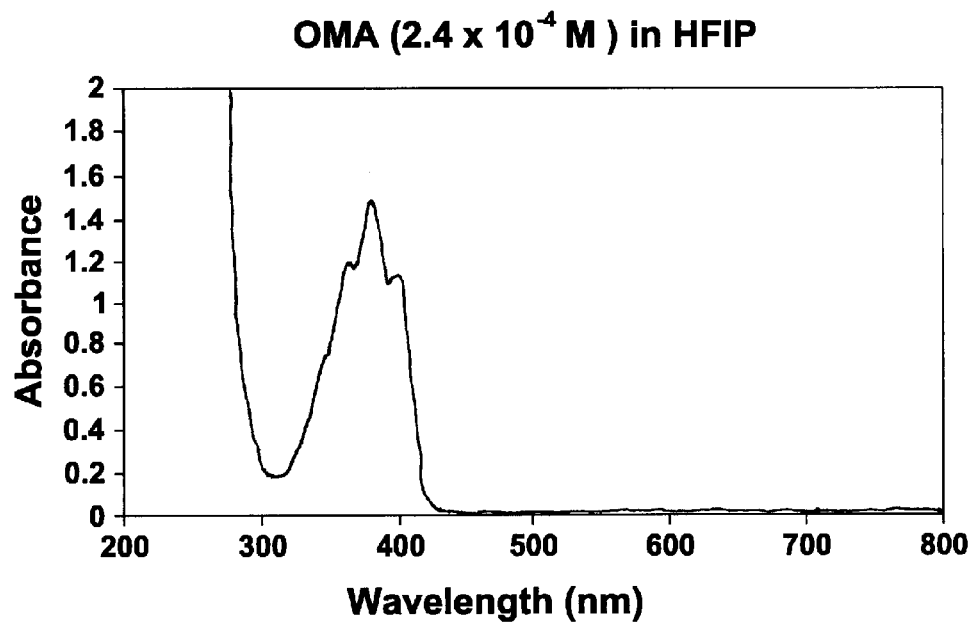
FIG. 3 describes the UV-visible absorption spectrum of non-protonated OMA in HFIP.

The UV radiation from the light source shown in FIG. 2 ultimately produces OMA in its protonated ground-state form. Once protonated, the OMA absorbs visible light in the blue region of the spectrum. The light source shown can be a single source of both UV and visible light, such as sunlight, or can include separate sources for both types of light. The UV-visible absorption spectrum of 1,2,3,4,5,6,7,8-octamethylanthracene (not protonated) is shown in FIG. 3. Note that OMA has a broad absorption band in the UV-A (320-400 nm) region of the solar spectrum, making this system a good candidate for photochromism in sunlight.

Figure 4:
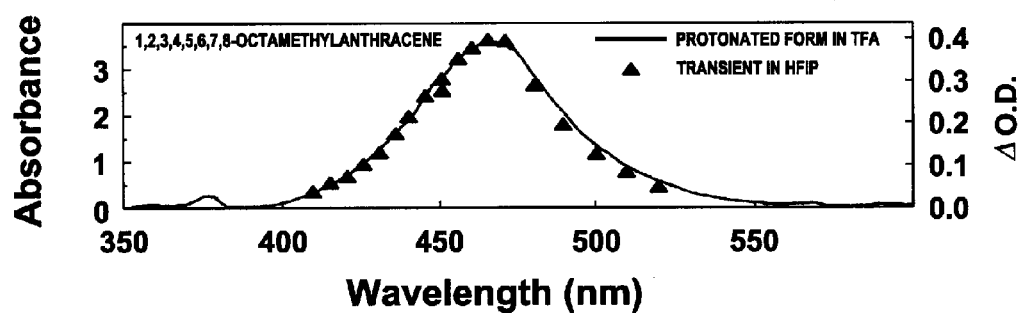
FIG. 4 shows the transient absorption spectrum of OMA in HFIP (right Y-axis) compared with the ground-state absorption spectrum of the protonated form in TFA (left Y-axis). Transient absorbance induced by the laser pulse is given in delta O.D., or change in optical density, units.

Referring to FIG. 4, when a solution of OMA in HFIP is excited with UV light at 351 nm, such as from an eximer laser, for example, the transient absorption spectrum shown is generated. The transient absorption spectrum, represented by triangles, shows a broad band centered in the blue at 465 nm. The transient spectrum is identical to the spectrum of ground-state OMA in the strong acid trifluoroacetic acid (TFA), indicating that the transient absorption is due to the protonated form of OMA. Ground-state OMA in strong acid is shown as a solid line. It is thus apparent that the excited state protonated form of OMA returns to the ground-state still in the protonated form. This ground-state protonated form is extremely long-lived in HFIP.

Figure 5:
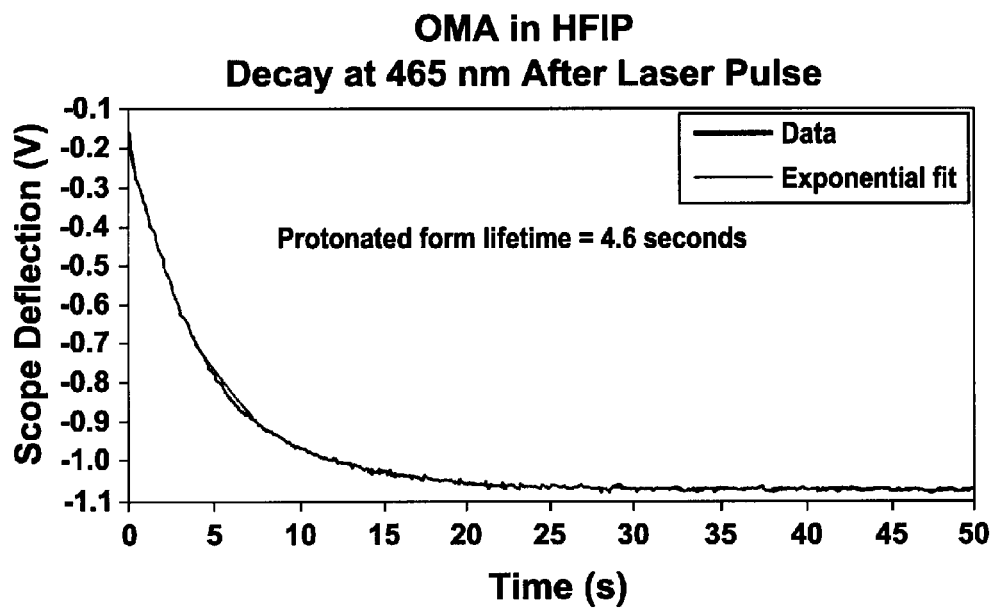
FIG. 5 shows the transient decay of OMA in HFIP.

FIG. 5 illustrates such a transient that shows first order decay with a lifetime in excess of 4.6 seconds. In the figure, the axis labeled "Scope Deflection" is a measured voltage related to the optical transmittance of the solution under test. Larger voltages correspond to less transmittance. The horizontal axis is the time after the solution is subject to a short (20 nano-second) laser pulse. These curves can be processed to calculate the change in optical density (transient absorbance) at the measured wavelength and are used to produce a transient spectrum such as the one in FIG. 4. With such a long lifetime, it is evident from FIG. 2 that under continuous irradiation, the population of $BH^+$ will begin to build up and reach a steady state.

Figure 6A:
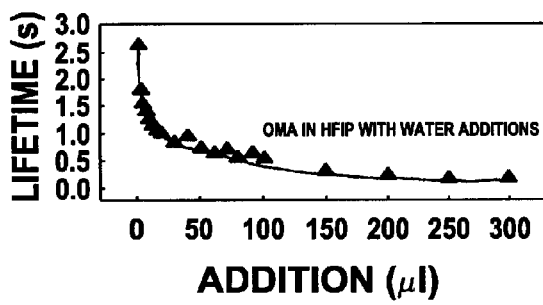
FIGS. 6a and 6b show the changes in OMA transient protonated form lifetime with water and acid additions, respectively.
Figure 6B:
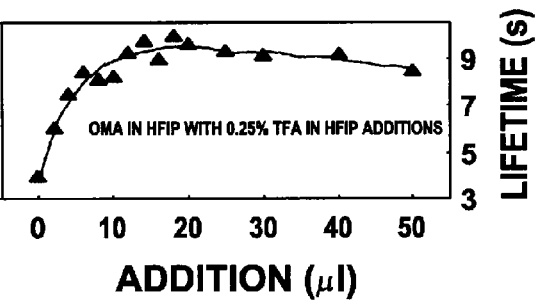

Referring to FIGS. 6*a* and 6*b*, it is apparent that the lifetime of photo-protonated OMA can be varied by the simple addition of base or acid. As shown respectively in these figures, the addition of base decreases the lifetime of the photo-protonated form, and acid increases this lifetime. With the addition of acid or base, the relaxation lifetime of the protonated form of OMA is adjustable over two orders of magnitude, i.e., between approximately 9 seconds to less than approximately 100 milliseconds. The lifetime of the protonated (colored) form can be tailored over a large range without having to modify the structure of the photochromic molecule.

Figure 7:
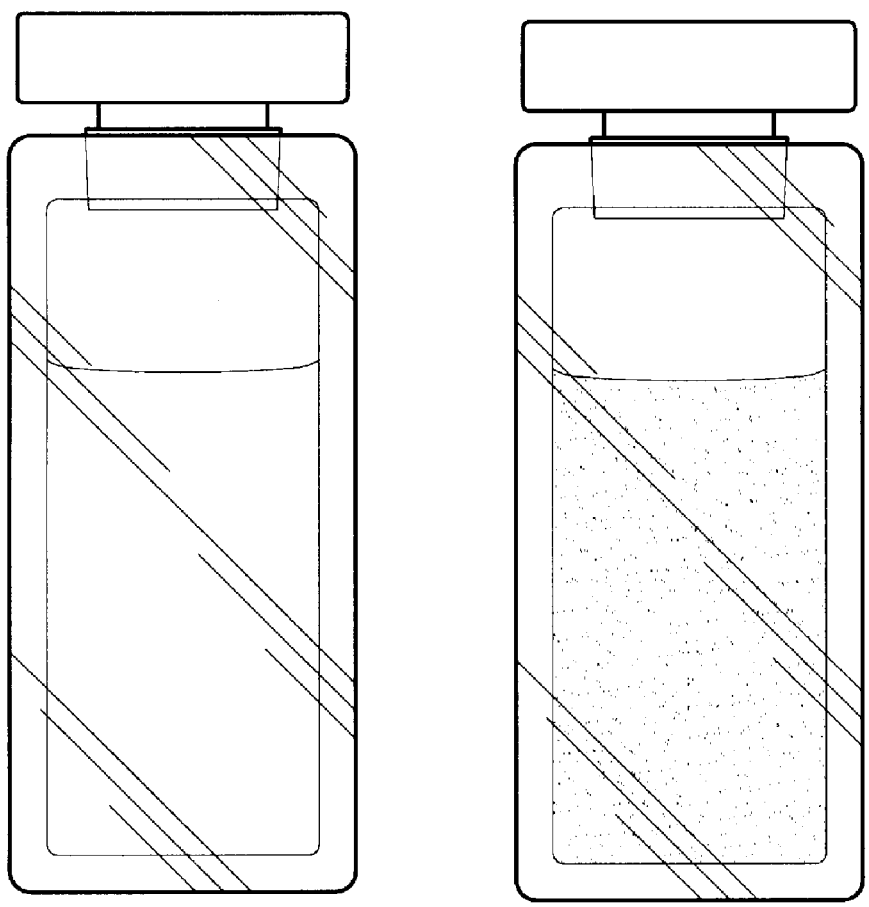
FIG. 7 shows OMA in HFIP without (clear) and with (orange) UV irradiation from the indoors and outdoors (sunlight), respectively.

FIG. 7 shows the appearance of OMA in HFIP without (clear) and with (colored) UV irradiation from sunlight. Outdoors the solution shows the characteristic orange color of the protonated form. Indoors, where the UV radiation from the sun is not strong, the OMA solution returns to a near colorless state. This effect is reversible over many cycles.

[1] Bouas-Laurent, Henri and Heinz Dürr, 2001. "Organic Photochromism", *Pure Appl. Chem.*, vol. 73, pp. 639-665.
[2] Ireland, J. F. and P. A. H Wyatt, 1976. "Acid-Base Properties of Electronically Excited states of Organic Molecules", *Advances in Physical Organic Chemistry*, vol. 12, pp. 132-221.
[3] McCormack, A. C., C. M. McDonnell, R. A. M. O'Ferrall, A. C. O'Doneghue, and S. N. Rao, 2002. "Protonated Benzofuran, Anthracene, Napthalene, Benzene, Ethene, and Ethyne: Measurements and Estimates of $pK_a$ and $pK_R$", *J. Am. Chem. Soc.*, vol. 124, pp. 8575-8583.
[4] Vander Donckt, E., D. Lietaer, and J. Nasielski, 1970. "Proprietes Acido-Basiques de Derives Aromatiques non Substitues dans les Etats Electroniques Excites Singulet et Triplet", *Bulletin des Societes Chemiques Belges*, vol. 79, pp. 283-290.
[5] Steenken, S, and R. A. McClelland, 1990. "248-nm Laser Flash Photoprotonation of Mesitylene, Hexamethylbenzene, and 1,3,5-Trimethoxybenzene in 1,1,1,3,3,3-Hexafluorosisopropyl Alcohol. Formation and Electrophilic Reactivities of the Cyclohexadienyl Cations", *J. Am. Chem. Soc.*, vol. 112, pp. 9648-9649.

Obviously, many modifications and variations of the invention are possible in light of the above description. It is therefore to be understood that within the scope of the claims, the invention may be practiced otherwise than as has been specifically described.

What is claimed is:

1. A method comprising:
   forming a solution of 1,2,3,4,5,6,7,8-octamethylanthracene (OMA) in 1,1,1,3,3,3-hexafluoro-2-propanol (HFIP); and
   selectively irradiating said solution with ultraviolet-visible light, said ultraviolet visible light of a wavelength of 351 nanometers, to protonate said OMA to $OMAH^+$; and
   wherein said step of selectively irradiating said solution with said ultraviolet-visible light both protonates said OMA and reversibly alters a coloration of said solution.

2. The method of claim 1 wherein said step of selectively irradiating said solution with said ultraviolet-visible light to protonate and reversibly alter said coloration of said solution comprises reversibly altering said coloration of said solution from a substantially clear state to a colored state upon said light irradiation.

3. The method of claim 2 which further comprises the step of selectively shortening the lifetime of said colored state by adding a base.

4. The method of claim 2, which further comprises the step of selectively adjusting the lifetime of said colored state to a period wherein the selectively adjustable lifetime of said colored state is between approximately nine seconds to less than approximately one hundred milliseconds.

5. The method of claim 2 which further comprises the step of lengthening the lifetime of the colored state by adding an acid.

6. A method comprising:
   forming a solution of 1,2,3,4,5,6,7,8-octamethylanthracene (OMA) in 1,1,1,3,3,3-hexafluoro-2-propanol (HFIP); and selectively irradiating said solution with ultraviolet-visible light, said ultraviolet visible light of a wavelength of 351 nanometers, to protonate said OMA to $OMAH^+$ to alter a coloration of said solution, said coloration being reversible between a substantially clear state when said solution is not irradiated with said light and a colored state when said solution is irradiated with said light.

7. The method of claim 6 which further comprises the step of selectively shortening the lifetime of the colored state by adding a base.

8. The method of claim 6 which further comprises the step of selectively adjusting the lifetime of said colored state to a period wherein the selectively adjustable lifetime of said colored state is between approximately nine seconds to less than approximately one hundred milliseconds.

9. The method of claim 6 which further comprises the step of lengthening the lifetime of the colored state by adding an acid.

\* \* \* \* \*